US008515375B2

United States Patent
Ye et al.

(10) Patent No.: US 8,515,375 B2
(45) Date of Patent: Aug. 20, 2013

(54) DYNAMIC BANDWIDTH CONTROL SCHEME OF A FRAC-N PLL IN A RECEIVER

(75) Inventors: Sheng Ye, Carlsbad, CA (US); Paul Chominski, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 181 days.

(21) Appl. No.: 12/944,521

(22) Filed: Nov. 11, 2010

(65) Prior Publication Data

US 2011/0280344 A1  Nov. 17, 2011

Related U.S. Application Data

(60) Provisional application No. 61/260,312, filed on Nov. 11, 2009.

(51) Int. Cl.
*H04B 1/06* (2006.01)
*H04B 7/00* (2006.01)

(52) U.S. Cl.
USPC .......................................... 455/260; 455/266

(58) Field of Classification Search
USPC ................. 455/260, 266, 296, 307; 331/1 R
See application file for complete search history.

(56) References Cited

U.S. PATENT DOCUMENTS

| 5,422,911 | A | 6/1995 | Barrett, Jr. et al. |
| 2006/0109939 | A1 | 5/2006 | Ciccarelli et al. |
| 2008/0013654 | A1 | 1/2008 | Rick et al. |
| 2008/0014894 | A1* | 1/2008 | Manku et al. ................. 455/318 |
| 2009/0115658 | A1 | 5/2009 | Zimmerman et al. |
| 2010/0273442 | A1* | 10/2010 | Zeng et al. .................... 455/208 |

OTHER PUBLICATIONS

International Search Report and Written Opinion corresponding to the PCT Application No. PCT/US2010/056418, mailed on Jan. 12, 2011, 12 pages.
International Preliminary Report on Patentability with Written Opinion for PCT Application No. PCT/US2010/056418, mailed May 34, 2012; 7 pages.

* cited by examiner

*Primary Examiner* — Nguyen Vo
(74) *Attorney, Agent, or Firm* — Kilpatrick Townsend & Stockton LLP; Ardeshir Tabibi

(57) ABSTRACT

A receiver includes a mixer, a filter, a received signal strength indicator, and a control loop. The mixer is adapted to convert the frequency of a received signal. The filter is adapted to filter out undesired signals that may be present in the output signal of the mixer. The received signal strength indicator is adapted to detect blocker (also known as jammer) signals that may be present in the output signal of the low-pass filter and generate a feedback signal in response. The control loop is adapted to vary its bandwidth in response to the feedback signal of the received signal strength indicator. The control loop supplies an oscillating signal to the mixer.

16 Claims, 1 Drawing Sheet

DYNAMIC BANDWIDTH CONTROL SCHEME OF A FRAC-N PLL IN A RECEIVER

CROSS-REFERENCES TO RELATED APPLICATIONS

The present application claims benefit under 35 USC 119 (e) of U.S. provisional application No. 61/260,312, filed Nov. 11, 2009, entitled "Dynamic Bandwidth Control Scheme Of A Frac-N PLL In A Receiver," the content of which is incorporated herein by reference in its entirety.

BACKGROUND OF THE INVENTION

The present invention relates to communication systems, and more particularly to minimizing the effect of blocker signals in such systems.

Controlling the bandwidth of a PLL in conventional systems is often achieved by ensuring that the PLL has acceptable in-band as well as out-of-band phase/noise performance characteristics. Such a PLL typically consumes a relatively large semiconductor area and/or power.

BRIEF SUMMARY OF THE INVENTION

A receiver, in accordance with one embodiment of the present invention, includes, in part, a mixer, a filter, a received signal strength indicator, and a control loop. The mixer is adapted to convert the frequency of a received signal. The filter is adapted to filter out undesired noise that may be present in the output signal of the mixer. The received signal strength indicator is adapted to detect blocker (also known as jammer) signals that may be present in the output signal of the low-pass filter and to generate a feedback signal in response. The control loop is adapted to vary its bandwidth in response to an output signal of the received signal strength indicator. The control loop supplies an oscillating signal to the mixer.

In one embodiment, the control loop is adapted to have a first bandwidth in response to detection of the blocker, and a second bandwidth in response to absence of detection of the blocker signal. In one embodiment, the received signal strength indicator detects the blocker signal if the blocker signal is detected as having a strength greater than a predefined threshold value. The received signal strength indicator does not detect the blocker signal if the blocker signal is not detected as having a strength greater than the predefined threshold value. In one embodiment, the receiver is a wireless receiver. In one embodiment, the bandwidth of the control loop is varied by varying a current supplied to the control loop. In one embodiment, the control loop is a phase-locked loop. In another embodiment, the control is a delay-locked loop. In yet another embodiment, the control loop is a frequency-locked loop.

A method of controlling the bandwidth of a control loop, in accordance with one embodiment of the present invention, includes in part, setting a feedback signal to a first state if the received signal is detected as having a strength greater than a first predefined threshold value, setting the feedback signal to a second state if the received signal is detected as not having a strength greater than the first predefined threshold value, and varying the bandwidth of the control loop in response to the feedback signal.

In one embodiment, the method further includes, in part, using an output signal of the control loop to control a conversion frequency of the received signal. In one embodiment, the method further includes filtering the frequency converted signal. In one embodiment, the control loop is a phase-locked loop, a delay-locked loop, or a frequency-locked loop. In one embodiment, the signal is received wirelessly. In one embodiment, the bandwidth of the control loop is varied by varying a current supplied to the control loop.

DETAILED DESCRIPTION OF THE INVENTION

Figure 1:
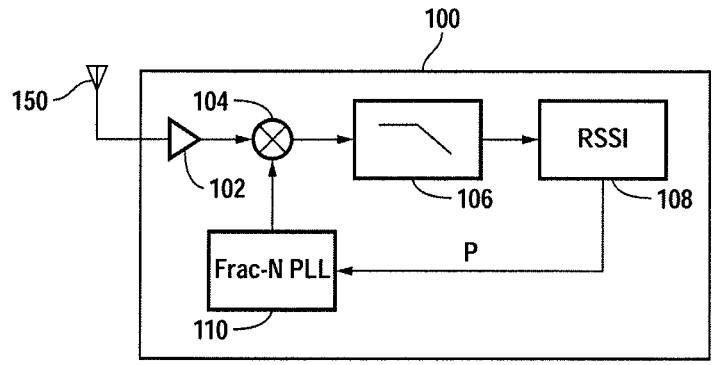
FIG. 1 is a block diagram of a receiver adapted to dynamically control the bandwidth of the phase-locked loop disposed therein, in accordance with one embodiment of the present invention.

FIG. 1 is a block diagram of a receiver 100 adapted to dynamically control the bandwidth of the phase-locked loop (PLL) disposed therein so as to minimize the out-of-band phase noise of the local oscillator (LO) signal generated by the PLL, in accordance with one embodiment of the present invention. Receiver 100 is shown as including, in part, a low-noise amplifier 102, a mixer 104, a low-pass filter 106, a received signal strength indicator (RSSI) 108, and a Frac-N PLL 110. Although the following description of the embodiments of the present invention is described with respect to a phase-locked loop, it is understood that the embodiments of the present invention are applicable to any other control loop disposed in a receiver, such as a delay-locked loop, frequency-locked loop, and the like.

Low-noise amplifier (LNA) 102 amplifies the incoming signal it receives from antenna 150 and supplies the amplified signal to mixer 104, which in response, converts the frequency of the signal it receives. Low-pass filter 106 is adapted to filter out undesired signals that may be present in the output signal of mixer 104. RSSI 108 is adapted to detect blocker (also known as jammer) signals that may be present in the output signal of low-pass filter 106 and supply a signal to frac-N PLL 110 accordingly. In response, frac-N PLL (alternatively referred to herein as PLL) 110 provides a local oscillator (LO) signal to mixer 104 which mixer 104 uses to convert the frequency of the signal it receives from LNA 102. As described further below, in accordance with embodiments of the present invention, the bandwidth of PLL 110 is dynamically controlled in response to the output signal of RSSI 108.

During operation, RSSI 108 monitors the strength of any blocker signal that may be present in the output signal of low-pass filter 106. If the blocker signal detected by RSSI 108 has a strength greater than a predefined threshold value, the output signal P of RSSI 108 is set to a first logic level (e.g., low logic level). Conversely, if the blocker signal detected by RSSI 108 has a strength smaller than or equal to a predefined threshold value, the output signal P of RSSI 108 is set to a second, complementary logic level (e.g., high logic level). Signal P is a feedback signal that is used to control the bandwidth of PLL 110. In response to the first logic level of signal P, i.e., in response to detecting that the blocker signal has a value higher than the predefined threshold value, PLL 110's bandwidth is reduced so as to minimize the out-of-band noise of the LO signal supplied by PLL 110 to mixer 104. In response to the second logic level of signal P, i.e., in response to detecting that the blocker signal has a value lower than or equal to the predefined threshold value, which in turn indicates that the desired signal has a sufficiently strong value relative to the blocker signal, PLL 110's bandwidth is increased, thereby causing a decrease in the in-band noise of the LO signal supplied by PLL 110 to mixer 104.

Figure 2:
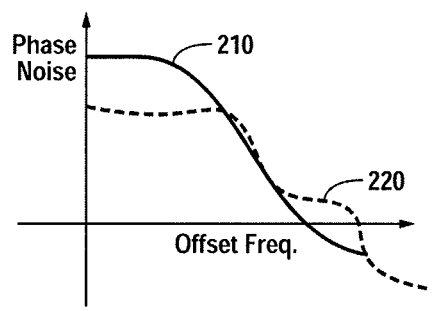
FIG. 2 shows plots of exemplary noise characteristic and bandwidth of a phase-locked loop in response to presence or absence of blocker signal, in accordance with one embodiment of the present invention.

Plot 210 of FIG. 2 shows an exemplary noise characteristic of PLL 110 when no blocker signal has been detected by RSSI 108, thereby causing the PLL to have a wider bandwidth. Plot 220 of FIG. 2 shows the noise characteristic of PLL 110 when RSSI 108 detects a blocker signal, thereby causing the PLL to have a narrower bandwidth.

Figure 3:
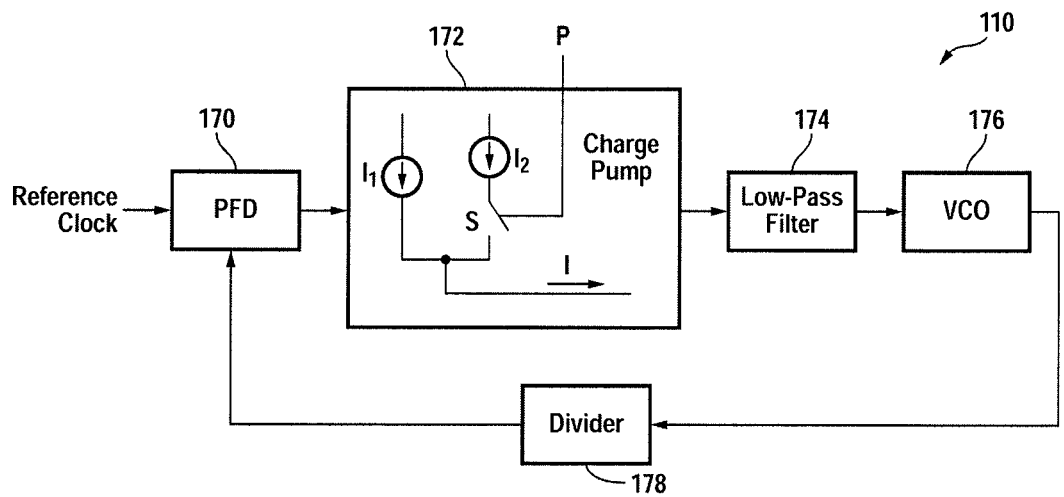
FIG. 3 is an exemplary block diagram of a phase-locked loop whose bandwidth is dynamically controlled, in accordance with one embodiment of the present invention.

FIG. 3 is a block diagram of an exemplary embodiment of PLL 110. PLL 110 is shown as including a phase/frequency detector 170, a charge pump 172, a low-pass filter 174, a voltage controlled oscillator (VCO) 178, and a divider 178. Signal P generated by RSSI 108 (see FIG. 1) is shown as being applied to charge pump 172 to control the amount of current that charge pump 172 supplies. When a blocker signal is detected and signal P is placed in the first logic state, a first current level $I_1$ is supplied to charge pump 172. When a blocker signal is not detected and signal P is placed in the second logic state, a second current level defined by the sum of currents $I_1$ and $I_2$ is supplied to charge pump 172. To achieve this, switch S is closed in response to the second logic state of signal P to enable current $I_2$ to also be supplied to the charge pump. Accordingly, PLL 110 is programmable to have two bandwidths. When a blocker signal is not detected, both currents $I_1$ and $I_2$ are delivered to charge pump 172, thereby causing PLL 110 to have a relatively higher bandwidth, as shown, for example, in plot 220 of FIG. 2. When a blocker signal is detected, only current $I_1$ is delivered to charge pump 172, thereby causing PLL 110 to have a relatively lower bandwidth, as shown, for example, in plot 210 of FIG. 2.

In accordance with embodiments of the present invention and as described above, the dynamic control of the PLL bandwidth meets the signal-to-noise ratio (SNR) of the receiver when the desired signal is strong and no blocker signal is detected, and further when an enhanced total phase noise from the local oscillator is required. Furthermore, the dynamic control of the PLL achieves low out-of-band phase noise requirement when a blocker signal is detected. The dynamic control of the PLL also relaxes the PLL design constraints.

The above embodiments of the present invention are illustrative and not limitative. Various alternatives and equivalents are possible. Other additions, subtractions or modifications are obvious in view of the present invention and are intended to fall within the scope of the appended claims.

What is claimed is:

1. A receiver comprising:
    a mixer;
    a filter responsive to the mixer;
    a received signal strength indicator (RSSI) coupled directly to the filter and adapted to detect one or more blocker signals; and
    a control loop adapted to vary its bandwidth in response to an output signal of the RSSI, said control loop supplying an oscillating signal to said mixer, said control loop comprising:
        a switch configured to change a current from a first non-zero value to a second non-zero value in response to an output signal of the RSSI, wherein said RSSI detects the one or more blocker signals if the one or more blocker signals are detected as having a strength greater than a predefined threshold value, and wherein said RSSI does not detect the one or more blocker signals if the one or more blocker signals are not detected as having a strength greater than the predefined threshold value.

2. The receiver of claim 1 wherein said control loop is adapted to have a first bandwidth in response to detection of the blocker signal by the RSSI, and a second bandwidth in response to no detection of the blocker signal by the RSSI.

3. The receiver of claim 1 wherein said receiver is a wireless receiver.

4. The receiver of claim 1 wherein the bandwidth of the control loop is varied from a first bandwidth to a second bandwidth by the switch.

5. The receiver of claim 1 wherein said control loop is selected from a group consisting of a phased-locked loop and a delay-locked loop.

6. The receiver of claim 1 wherein the second non-zero value is equal to a sum of the first non-zero value and a third non-zero value that is added to the first non-zero value when the switch is in a closed position.

7. The receiver of claim 6 wherein the first non-zero value determines a low bandwidth of the control loop and the second non-zero value determines a high bandwidth of the control loop.

8. The receiver of claim 1 wherein said control loop is a fractional-N phase-locked loop.

9. A method of controlling a bandwidth of a control loop, the method comprising:
    setting a feedback signal to a first state if a received signal is detected as having a strength greater than a first predefined threshold value;
    setting the feedback signal to a second state if the received signal is detected as not having a strength greater than the first predefined threshold value; and
    changing a current via a switch so as to vary the bandwidth of the control loop, wherein the feedback signal turns on and off the switch.

10. The method of claim 9 further comprising:
    using an output signal of the control loop to control a conversion frequency of the received signal.

11. The method of claim 10 further comprising:
    filtering the frequency converted signal.

12. The method of claim 10 wherein said control loop is a phase-locked loop.

13. The method of claim 10 wherein said received signal is received wirelessly.

14. The method of claim 9 wherein said switch changes the current from a first current amount to a second current amount.

15. The method of claim 14 wherein the second current amount is equal to a sum of the first current amount and a third current amount that is added to the first current amount when the switch is in a closed position.

16. The method of claim 15 wherein the first current amount determines a first bandwidth of the control loop and the second current amount determines a second bandwidth of the control loop.

* * * * *